United States Patent
Chigullapalli et al.

(10) Patent No.: US 10,763,218 B2
(45) Date of Patent: Sep. 1, 2020

(54) ELECTRICAL DEVICES AND METHODS FOR FORMING ELECTRICAL DEVICES

(71) Applicant: Intel Corporation, Santa Clara, CA (US)

(72) Inventors: Sruti Chigullapalli, Chandler, AZ (US); Leslie Fitch, Chandler, AZ (US); Boping Wu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/079,105

(22) PCT Filed: Mar. 24, 2016

(86) PCT No.: PCT/US2016/023868
§ 371 (c)(1),
(2) Date: Aug. 23, 2018

(87) PCT Pub. No.: WO2017/164873
PCT Pub. Date: Sep. 28, 2017

(65) Prior Publication Data
US 2019/0074252 A1    Mar. 7, 2019

(51) Int. Cl.
*H01L 23/552* (2006.01)
*H01L 23/60* (2006.01)
*H01L 23/10* (2006.01)
*H01L 23/367* (2006.01)
*H01L 23/498* (2006.01)
*H01L 25/065* (2006.01)
*H05K 9/00* (2006.01)
(Continued)

(52) U.S. Cl.
CPC ............ *H01L 23/552* (2013.01); *H01L 23/10* (2013.01); *H01L 23/367* (2013.01); *H01L 23/60* (2013.01); *H01L 25/065* (2013.01); *H05K 7/20409* (2013.01); *H05K 9/0015* (2013.01); *H05K 9/0032* (2013.01); *H01L 23/42* (2013.01); *H01L 23/49827* (2013.01); *H01L 25/0655* (2013.01); *H01L 2224/16227* (2013.01); *H01L 2224/73253* (2013.01)

(58) Field of Classification Search
CPC .......... H01L 23/373–3738; H01L 23/552–556
See application file for complete search history.

(56) References Cited

U.S. PATENT DOCUMENTS

2011/0176279 A1* 7/2011 Zhao ................... H01L 21/4878
                                                            361/720
2014/0078677 A1* 3/2014 Dolci ...................... H01L 23/10
                                                            361/719

FOREIGN PATENT DOCUMENTS

JP          2003218564 A  *  7/2003

* cited by examiner

*Primary Examiner* — Daniel P Shook
(74) *Attorney, Agent, or Firm* — 2SPL Patent Attorneys PartG mbB; Kieran O'Leary (57) ABSTRACT

An electrical device includes at least one electrical component arranged on a carrier substrate and sidewalls of an electromagnetic shielding encapsulation arranged on the carrier substrate. The sidewalls of the electromagnetic shielding encapsulation laterally surround the at least one electrical component. Further, the electrical device includes a heat sink mounted to the sidewalls of the electromagnetic shielding encapsulation. The heat sink forms a cap of the electromagnetic shielding encapsulation and the heat sink includes surface-enlarging structures at a front side of the heat sink.

19 Claims, 5 Drawing Sheets (51) Int. Cl.
*H05K 7/20* (2006.01)
*H01L 23/42* (2006.01)

ELECTRICAL DEVICES AND METHODS FOR FORMING ELECTRICAL DEVICES

TECHNICAL FIELD

The present disclosure relates to package concepts for electrical devices and in particular to electrical devices and methods for forming electrical devices

BACKGROUND

A large variety of package concepts for electrical devices are known. The package used for a specific electrical device may be selected depending on the heat dissipation, the electromagnetic compatibility, the desired application and/or the space consumption of the electrical device and/or the selected package. It may be desired to improve the heat dissipation and/or the electromagnetic compatibility and/or to reduce the space consumption of packaged electrical devices.

BRIEF DESCRIPTION OF THE FIGURES

Some examples of apparatuses and/or methods will be described in the following by way of example only, and with reference to the accompanying figures, in which

FIG. 1b shows a schematic top view of the electrical device shown in FIG. 1a;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or electrical device components, but do not preclude the presence or addition of one or more other features, integers, steps, operations, elements, electrical device components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Electrical components or devices are embedded in packages to provide protection against impact and corrosion, to hold the contact pins or leads and/or to dissipate heat produced by the device and/or reduce electromagnetic emissions, for example. For example, a semiconductor package may contain one or more semiconductor components. Individual components may be formed at a silicon wafer before being cut and assembled in a package. A semiconductor package may have only few leads or contacts for devices such as diodes, or may have hundreds of connections in case of a microprocessor, for example. In addition to providing connections to the semiconductor and handling waste heat, the semiconductor package can protect the semiconductor die against the ingress of moisture, for example. Similarly, non-semiconductor electrical components (e.g. resistors, capacitors, inductors) may be arranged in packages. Several electrical components may be arranged in a module and/or on a printed circuit board PCB.

Figure 1A:
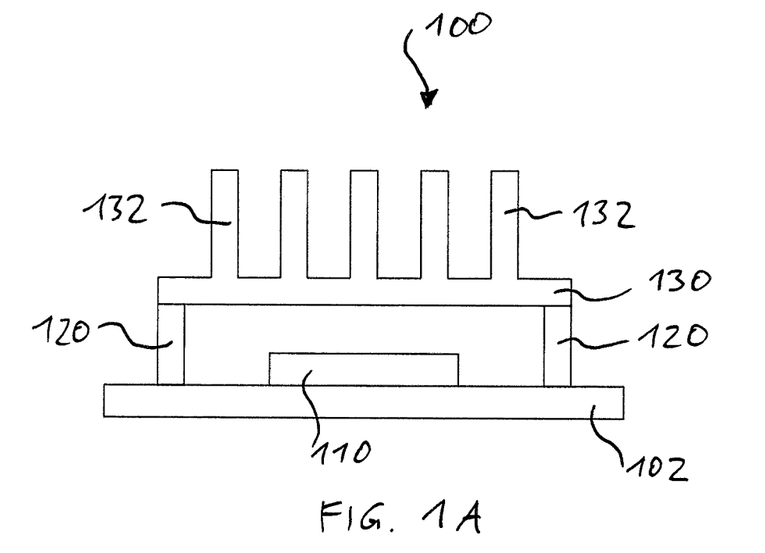
FIG. 1a shows a schematic cross section of an electrical device.
Figure 1B:
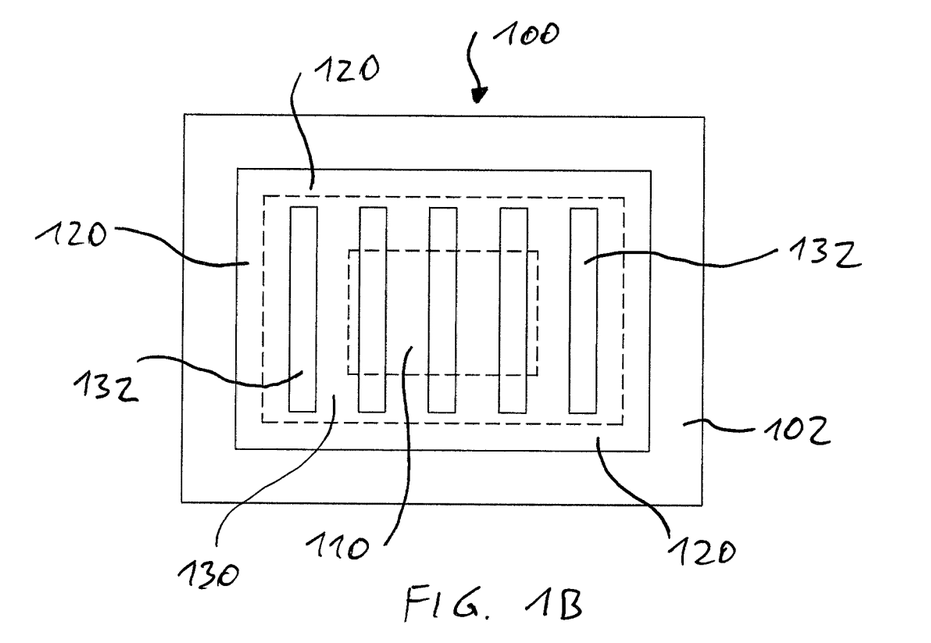

FIGS. 1a and 1b show a schematic cross section and a schematic top view of an electrical device according to an example. The electrical device 100 includes at least one electrical component 110 arranged on a carrier substrate 102 and sidewalls 120 of an electromagnetic shielding encapsulation arranged on the carrier substrate 102. The sidewalls 120 of the electromagnetic shielding encapsulation laterally surround the at least one electrical component 110. Further, the electrical device 100 includes a heat sink 130 mounted to the sidewalls 120 of the electromagnetic shielding encapsulation. The heat sink 130 forms a cap of the electromagnetic shielding encapsulation. Further, the heat sink 130 includes surface-enlarging structures 132 at a front side of the heat sink 130.

By using the heat sink as a cap for an electromagnetic shielding encapsulation of an electrical device, the number of components of the package or module of the electrical component may be reduced and/or the space consumption of the package or module of the electrical component may be reduced.

For example, the sidewalls 120 laterally define or border the space enclosed by the electromagnetic shielding encapsulation. The heat sink 130 covers the space defined by the sidewalls 120 and defines or borders the space of the electromagnetic shielding encapsulation in a vertical direction opposite to the carrier substrate so that the heat sink 130 represents a cap of the electromagnetic shielding encapsulation, for example. In other words, the space enclosed by the electromagnetic shielding encapsulation may be defined by the carrier substrate, the side walls and a back side of the heat sink 130. The electromagnetic shielding encapsulation may implement a radio frequency shield together with a heat sink, for example. The heat sink 130 may comprise predominately aluminum (e.g. more than 70% aluminum) and/or predominately copper (e.g. more than 70% copper) or may consist of an aluminum alloy and/or a copper alloy. The back side of the heat sink 130 may be an aluminum surface or a copper surface, for example.

The surface-enlarging structures 132 are portions of the heat sink, which increases a size of the surface of the front side of the heat sink 130 in comparison to a plane surface to increase a heat dissipation capability of the heat sink 130. The surface-enlarging structures 132 may comprise various geometries. For example, the surface-enlarging structures 132 of the heat sink 130 may be represented by a plurality of fin-shaped structures or pin-shaped structures (e.g. fins or pins) at the front side of the heat sink 130. For example, a body portion of the heat sink 130 and the surface-enlarging structures 132 of the heat sink 130 are one-pieced (e.g. a single piece of aluminum or copper). A surface of the body portion may form a back side (e.g. substantially plane back side surface) of the heat sink 130.

A back side (e.g. substantially plane surface) of the heat sink 130 may be mounted or fixed on top of the sidewalls 120 of the electromagnetic shielding encapsulation. For example, the heat sink 130 may be glued onto the sidewalls 130 by an electrical conductive adhesive or a gasket material. The gasket material may have a thermal conductivity of more than 3 W/(m*K) (or more than 7 W/(m*K) or more than 10 W/(m*K) or between 3 W/(m*K) and 17 W/(m*K)) and/or an electrical resistivity of less than $1*10^{-1}$ Ωm (or less than $1*10^{-3}$ Ωm, less than $1*10^{-5}$ Ωm or less than $1*10^{-6}$ Ωm). The gasket material may enable a heat transfer from the side walls 120 to the heat sink 130 and may enable an electromagnetic shielding of the at least one electrical component 110 due to the electrical radiation and interference characteristic. For example, the gasket material may be a conductive carbon rubber material or a carbon filled silicon rubber CSR material. The gasket material may compensate unevennesses or a roughness of the back side of the heat sink 130 and/or the top of the sidewalls 120. The gasket material may seal a gap between the heat sink 130 and the sidewalls 120 of the electromagnetic shielding encapsulation.

The sidewalls 120 of the electromagnetic shielding encapsulation laterally surround the at least one electrical component 110. For example, the sidewalls 120 enclose the at least one electrical component 110 in two dimensions (lateral dimensions in parallel to a surface of the carrier substrate), while the carrier substrate 102 and the heat sink 130 border or limit the electromagnetic shielding encapsulation in the third dimension (vertical dimension orthogonal to a surface of the carrier substrate). For example, the sidewalls 120 enclose a lateral area larger than a lateral area of the carrier substrate 102 occupied by the at least one electrical component 110. A lateral gap may exist between at least one sidewall of the electromagnetic shielding encapsulation and an edge of the at least one electrical component 110. The sidewalls 120 of the electromagnetic shielding encapsulation may be manufactured in various ways. For example, the sidewalls may be deposited by electroplating or a preformed sidewall structure may be attached or mounted (e.g. glued or soldered) to the carrier substrate. For example, the sidewalls 120 of the electromagnetic shielding encapsulation may be formed or implemented by a stamped sheet metal structure or a tin-plated stainless steel structure. For example, the sidewalls 120 of the electromagnetic shielding encapsulation may have an electrical resistivity of less than $1*10^{-3}$ Ωm (or less than $1*10^{-5}$ Ωm, less than $1*10^{-6}$ Ωm or less than $1*10^{-7}$ Ωm).

A height of the sidewalls 120 may define or set the vertical dimension or extension of the space enclosed by the electromagnetic shielding encapsulation. A height of the sidewalls 120 of the electromagnetic shielding encapsulation may be larger than a height of the electrical component. A vertical gap may remain vertically between the electrical component and a backside of the heat sink 130. Alternatively, a gap filler structure may be arranged in the gap between the at least one electrical component and a back side of the heat sink 130 to improve the heat dissipation. Alternatively, the height of the sidewalls 120 may be equal or slightly less (considering a space of an adhesive or gasket material) than a height (vertical dimension) of the at least one electrical component or the highest electrical component enclosed by the electromagnetic shielding encapsulation. In this example, the at least one electrical component or the highest component may be directly in contact with a back side of the heat sink 130.

Optionally, the electrical device 100 comprises a gap filler structure arranged between the at least one electrical component and a back side of the heat sink 130. For example, the gap filler structure is in contact with the at least one electrical component 110 and the back side of the heat sink 130. The gap filler structure may comprise a thermal conductivity of more than 3 W/(m*K) (or more than 7 W/(m*K) or more than 10 W/(m*K) or between 3 W/(m*K) and 17 W/(m*K)). The gap filler structure may cover at least a part of a surface of the at least one electrical component 110 or may comprise a larger lateral dimension than the at least one electrical component 110 (e.g. the gap filler structure may over hang the at least one electrical component). The gap filler structure may comprise a deformable material with high thermal conductivity. For example, the gap filler material may be significantly more deformable than the heat sink 130 and/or the at least one electrical component. For example, the gap filler on top of the at least one electrical component may reach vertically higher than the sidewalls 120 before mounting the heat sink 130 and may be compressed or deformed during mounting the heat sink 130.

For example, the at least one electrical component 110 may be a semiconductor device (e.g. including at least one semiconductor die), an integrated passive device, a microelectromechanical system device or a surface mounted device. For example, the at least one electrical component 110 may be a central processing unit CPU, a memory device, a transmitter device, a receiver device or a transceiver device or a system-on-chip SOC (e.g. comprising a CPU and a transceiver device). The electrical device 100 may comprise more than one electrical component. For example, at least a second electrical component may be arranged on the carrier substrate 102 and within the electromagnetic shielding encapsulation.

Different electrical components of the electrical device 100 may be arranged in different encapsulation chambers of the electromagnetic shielding encapsulation. For example, the electrical device may comprise additionally at least one internal sidewall of the electromagnetic shielding encapsulation. The at least one internal sidewall of the electromagnetic shielding encapsulation may separate at least two encapsulation chambers of the electromagnetic shielding encapsulation from each other. For example, at least one electrical component may be arranged within each of the at least two encapsulation chambers of the electromagnetic shielding encapsulation.

The carrier substrate 102 may be a printed circuit board PCB, a module board or a semiconductor package substrate (e.g. flip chip substrate).

Figure 2:
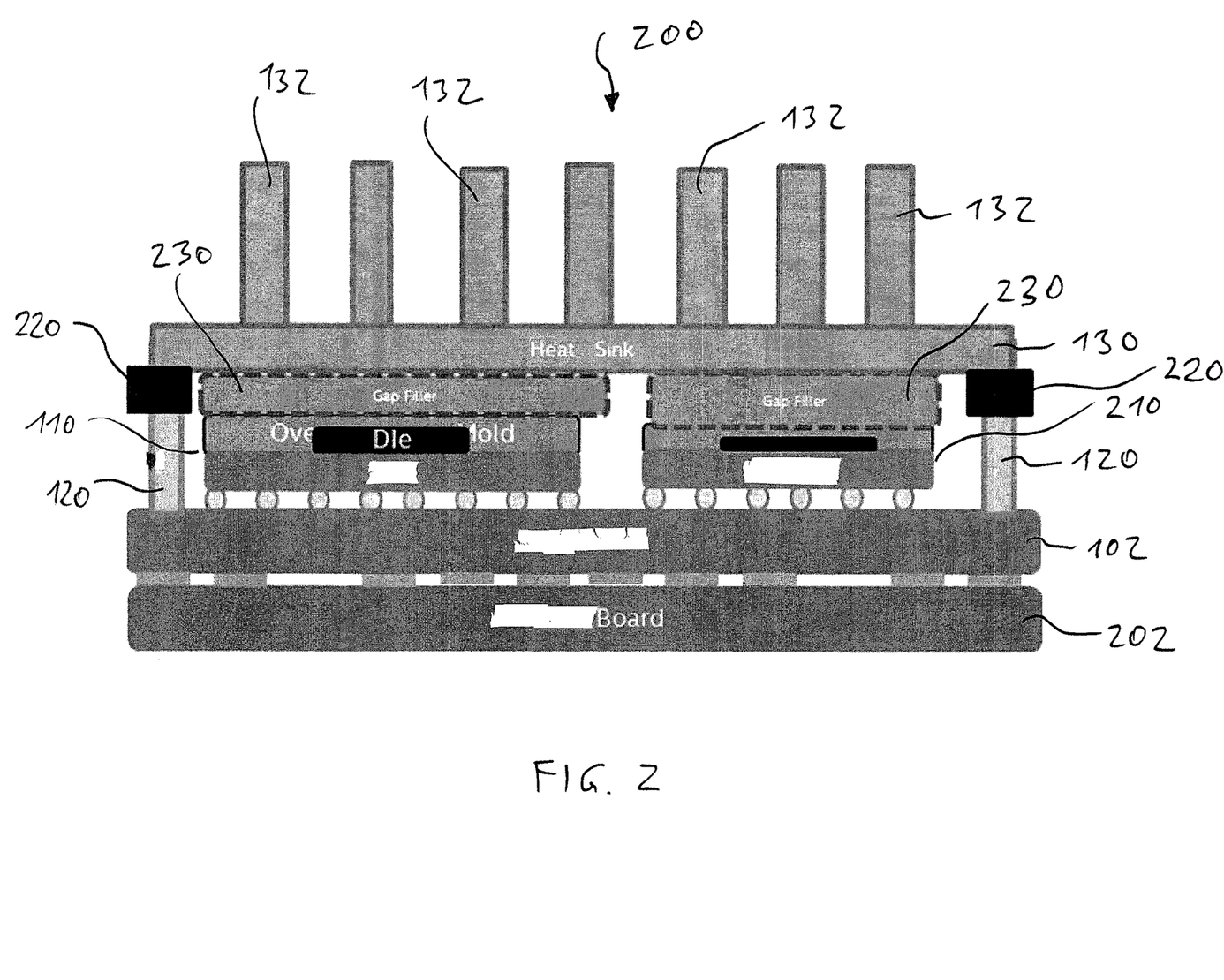
FIG. 2 shows a schematic cross section of an electrical device comprising two semiconductor devices.

FIG. 2 shows a schematic cross section of an electrical device 200 comprising two semiconductor devices according to an example. The implementation of the electrical device 200 is similar to the implementation shown in FIG. 1. The electrical device 200 comprises two electrical components 110, 210 arranged in a common encapsulation chamber of an electromagnetic shielding encapsulation. The two electrical components 110, 210 are semiconductor devices comprising at least one semiconductor die each. The semiconductor dies are mounted on semiconductor die package substrates and are surrounded by an over die mold (molding compound). The semiconductor die package substrates may comprise, for example, ball grid areas soldered to the carrier substrate 102. The carrier substrate 102 may be a module substrate soldered to a board 202 (e.g. printed circuit board). The electromagnetic shielding encapsulation is built by the carrier substrate 102, the sidewalls 120, the heat sink 130 and gasket material 220 sealing a gap between the sidewalls 120 and the heat sink 130 (and fixing the heat sink to the sidewalls). The heat sink 130 comprises fin-shaped or pin-shaped structures at a front side. Gap filler structures 230 are arranged between the two electrical components 110, 210 and the back side of the heat sink 130. The two electrical components 110, 210 can comprise different vertical heights, which may be compensated by gap filler structures 230 with different heights.

FIG. 2 may show an example of a hybrid solution saving one or more electrical components from thermal run-away and may enable the reduction of the overall stack-height (e.g. by more than 0.3 mm) and/or the reduction of interface resistance (e.g. thermal resistance between the at least one electrical component and the heat sink) by more than 30% (e.g. 50%).

An example for the junction temperature for a use case of 3.3 W on the system for a proposed hybrid solution may be about 2-5° C. less than the same under other setups. For example, in view of the narrow gap between the maximal junction temperature and industrial ambient (e.g. Tjmax (110° C.)–ambient (85° C.)=25 C), even this low improvement in Tj may help with the de-rating curve.

More details and aspects are mentioned in connection with the examples described above or below. The example shown in FIG. 2 may comprise one or more optional additional features corresponding to one or more aspects mentioned in connection with the proposed concept or one or more examples described above (e.g. FIGS. 1A and 1B) or below (e.g. FIG. 3-5).

Figure 3:
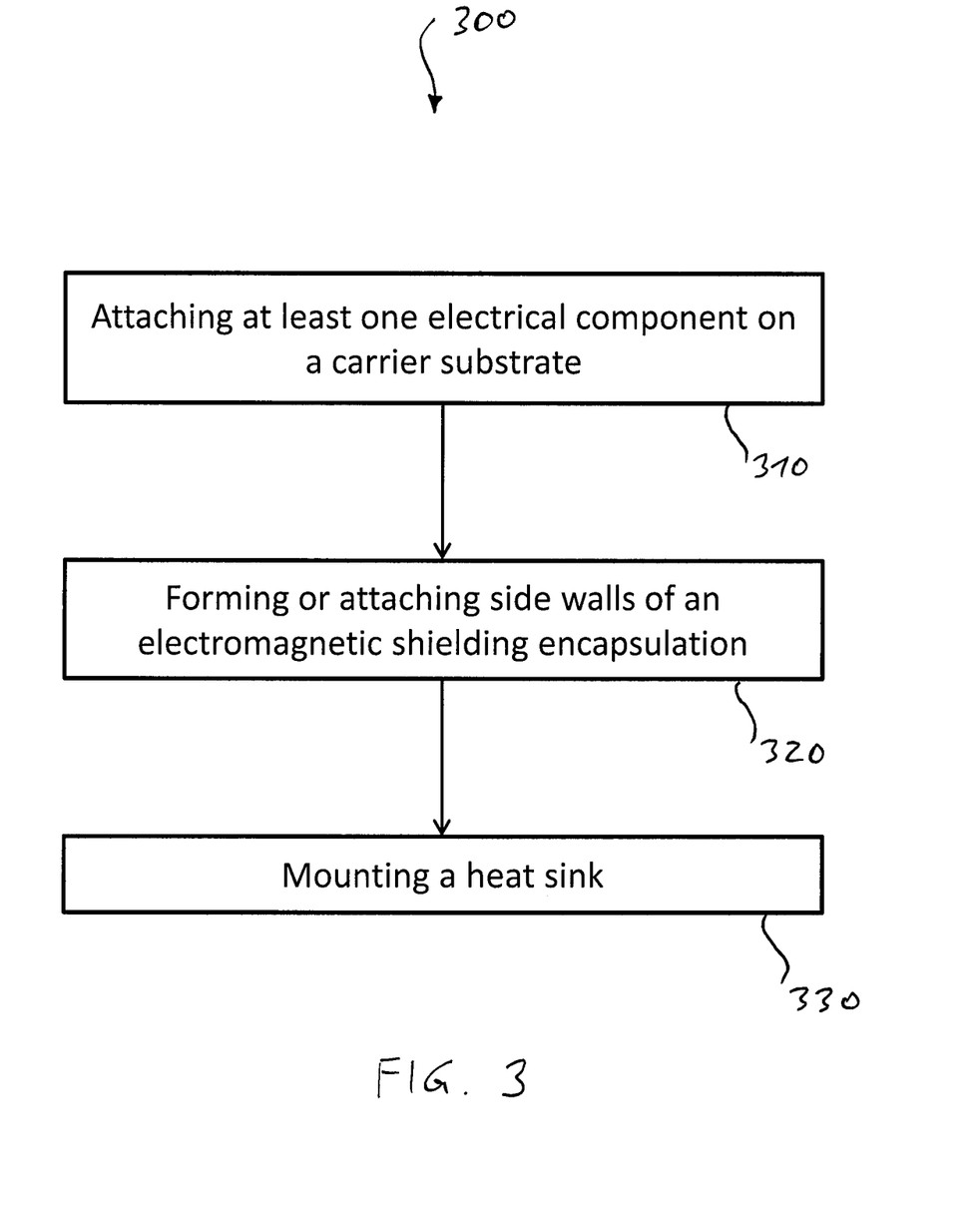
FIG. 3 shows a flow chart of a method for forming an electrical device.

FIG. 3 shows a flow chart of a method for forming an electrical device according to an example. The method 300 comprises attaching 310 at least one electrical component on a carrier substrate and forming or attaching 320 side walls of an electromagnetic shielding encapsulation on the carrier substrate before or after attaching 310 the at least one electrical component. The sidewalls of the electromagnetic shielding encapsulation laterally surround the at least one electrical component. Further, the method 300 comprises mounting 330 a heat sink to the sidewalls of the electromagnetic shielding encapsulation. The heat sink forms a cap of the electromagnetic shielding encapsulation. Further, the heat sink comprises surface-enlarging structures at a front side of the heat sink.

By using the heat sink as a cap for an electromagnetic shielding encapsulation of an electrical device, the number of components of the package or module of the electrical component may be reduced and/or the space consumption of the package or module of the electrical component may be reduced.

For example, mounting 330 the heat sink may comprise fixing the heat sink on the sidewalls of an electromagnetic shielding encapsulation by a gasket material or an electrical conductive adhesive.

For example, the sidewalls may be formed (e.g. deposited) directly on the carrier substrate. Alternatively, the side walls may be attached 320 by attaching preformed sidewall structures (e.g. stamped metal sheet side walls or tin-plated stainless steel side walls) on the carrier substrate.

Optionally, the method 300 may further comprise forming or attaching a gap filler structure on the at least one electrical component. The heat sink may be mounted 330 after forming or attaching the gap filler structure so that the gap filler structure is in contact with the back side of the heat sink.

More details and aspects are mentioned in connection with the examples described above or below. The example shown in FIG. 3 may comprise one or more optional additional features corresponding to one or more aspects mentioned in connection with the proposed concept or one or more examples described above (e.g. FIG. 1A, 1B or 2) or below (e.g. FIG. 4-5).

Figure 4:
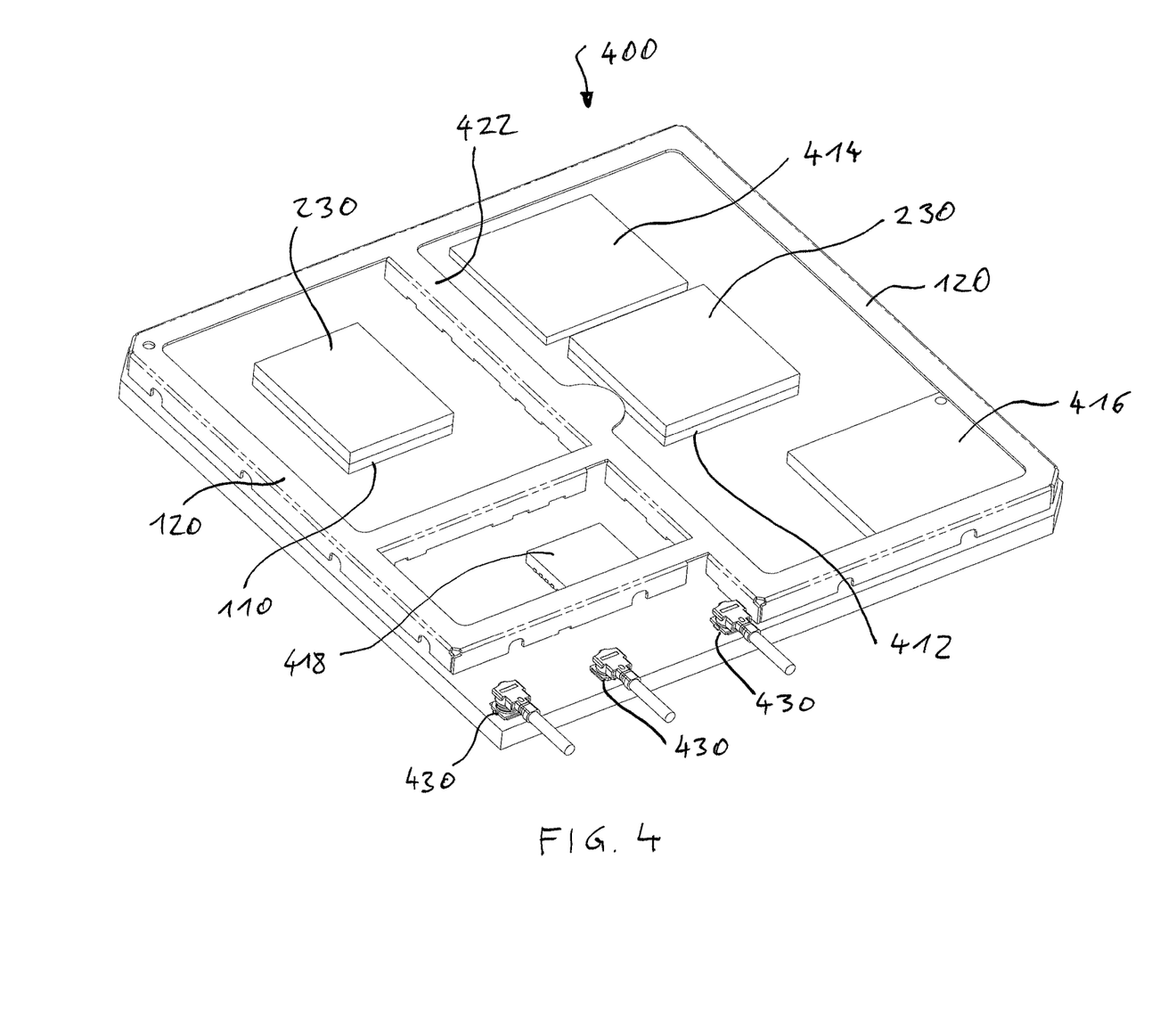
FIG. 4 shows a schematic three-dimensional illustration of an electrical device after forming sidewalls.

FIG. 4 shows a schematic three-dimensional illustration of an electrical device after forming sidewalls and before forming gasket material on top of the sidewalls according to an example. The implementation of the electrical device 400 is similar to the implementation shown in FIG. 1 or 2, for example. The electrical device 400 is illustrated before forming the gasket material and before mounting the heat sink. The electrical device 400 comprises an electromagnetic shielding encapsulation comprising four encapsulation chambers enclosing different electrical components. The electromagnetic shielding encapsulation comprises internal sidewalls 422 separating the four encapsulation chambers from each other. For example, a first encapsulation chamber encloses a first electrical component 110 (e.g. a transceiver device) attached to the carrier substrate 102 (e.g. module substrate). A gap filler structure 230 is located on top of the first electrical component 110 to improve the heat dissipation from the first electrical component 110 to the heat sink 130. A second encapsulation chamber encloses a second electrical component 412 (e.g. a processor device) and a third electrical component 414 (e.g. memory device) attached to the carrier substrate 102. A gap filler structure 230 is located on top of the second electrical component 414 to improve the heat dissipation from the second electrical component 414. The power consumption and/or heat dissipation of the third electrical component 414 may be low so that a gap filler structure may be unnecessary. A third encapsulation chamber encloses a fourth electrical component 416 attached to the carrier substrate 102 and a fourth encapsulation chamber encloses a fifth electrical component 418 attached to the carrier substrate 102. Further, three antenna connectors 430 are mounted on the carrier substrate 102 outside the electromagnetic shielding encapsulation. For example, the first electrical component 110 is electrically coupled or connected to at least one antenna located outside the electromagnetic shielding encapsulation.

Figure 5:
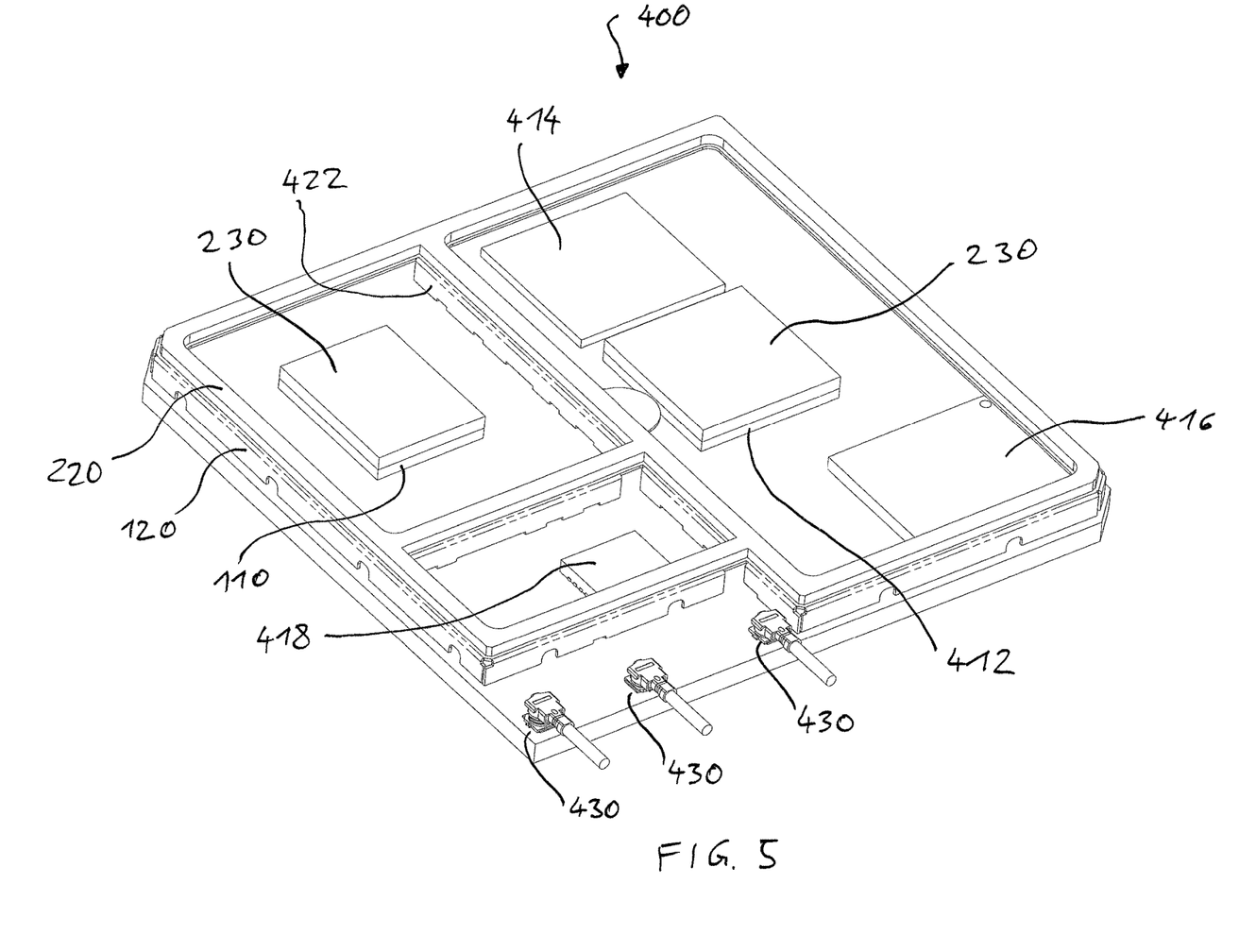
FIG. 5 shows a schematic three-dimensional illustration of the electrical device shown in FIG. 4 after forming gasket material on top of the sidewalls.

FIG. 5 shows a schematic three-dimensional illustration of the electrical device 400 shown in FIG. 4 after forming gasket material 220 (e.g. radio frequency gasket) on top of the sidewalls and before mounting the heat sink directly on top (of the gasket material).

The sealing of the two interfaces (heat sink and top of the shield wall) may be difficult. For example, a carbon filled silicone rubber CSR gasket may be used that may provide the protection against damage from rain, sun, wind, and/or dust.

More details and aspects are mentioned in connection with the examples described above or below. The example shown in FIGS. 4 and 5 may comprise one or more optional additional features corresponding to one or more aspects mentioned in connection with the proposed concept or one or more examples described above (e.g. FIG. 1A-3) or below.

Some examples relate to a hybrid radio frequency RF shield and heatsink for combined electromagnetic interference/electromagnetic compatibility EMI/EMC shielding and thermal dissipation. For example, a RF shielding without compromising thermal performance at high ambient temperature may be enabled.

For example, the implementation of an electrical device comprising a central processing unit (e.g. multi-core CPU) and an integrated transceiver (e.g. 3G (third generation) and/or 4G LTE (fourth generation long term evolution) transceiver) in a single module may be enabled, for example, for an internet of things application.

According to an aspect, the bottom side of the heat sink is used as the top of the RF shield (e.g. enabling getting rid of 2 extra interfaces). A reliable leak-proof mating between the side-walls of the shield and the bottom surface of the heat-sink may be provided based on the proposed concept. For example, tin-plated stainless steel may be used for the side walls, black-anodized aluminum may be used for the heat sink, a thermally conductive shielding gasket may be used and a thermally conductive gap-filler may be used to touch the SOC and the heatsink.

According to an aspect, a module (e.g. a CPU system-on-chip SOC with WIFI and 3G) may obtain a RF shielding or encapsulation based on the proposed concept. In this way, an industrial temperature rating (e.g. 85° C. ambient temperature) may be enabled by cooling the SOC such that the junction remains below the maximal junction temperature Tjmax to avoid thermal runaways, for example. A thermal solution and RF shield without compromising the functionality of either may be provided.

For example, the proposed concept may be implemented at a low-cost SOC with WIFI and/or 3G capability rated to industrial temperature.

For example, at least one electrical component of a proposed electrical device may be a radio frequency RF equipment operating above 31.8 GHz.

An expansion of the total addressable market TAM for original equipment manufacturers OEM, independent software vendors ISV and/or manufacturers may be enabled.

In the following, some examples are described. Example 1 is an electrical device comprising at least one electrical component arranged on a carrier substrate, sidewalls of an electromagnetic shielding encapsulation arranged on the carrier substrate, wherein the sidewalls of the electromagnetic shielding encapsulation laterally surround the at least one electrical component and a heat sink mounted to the sidewalls of the electromagnetic shielding encapsulation, wherein the heat sink forms a cap of the electromagnetic shielding encapsulation, wherein the heat sink comprises surface-enlarging structures at a front side of the heat sink.

In example 2, the subject matter of example 1 can optionally include the heat sink being fixed on the sidewalls of an electromagnetic shielding encapsulation by a gasket material.

In example 3, the subject matter of example 2 can optionally include the gasket material having a thermal conductivity of more than 3 W/(m*K).

In example 4, the subject matter example 2 or 3 can optionally include the gasket material having an electrical resistivity of less than $1*10^{-1}$ Ωm.

In example 5, the subject matter of one of the examples 2-4 can optionally include the gasket material being a conductive carbon rubber material or a carbon filled silicon rubber material.

In example 6, the subject matter of one of the examples 2-5 can optionally include the gasket material sealing a gap between the heat sink and the sidewalls of the electromagnetic shielding encapsulation.

In example 7, the subject matter of one of the examples 1-6 can optionally include the heat sink comprising at least one of aluminum and copper.

In example 8, the subject matter of one of the examples 1-7 can optionally include the surface-enlarging structures of the heat sink being a plurality of fin-shaped structures or pin-shaped structures.

In example 9, the subject matter of one of the examples 1-8 can optionally include a body portion of the heat sink and the surface-enlarging structures of the heat sink being one-pieced, wherein a surface of the body portion forms a back side of the heat sink.

In example 10, the subject matter of one of the examples 1-9 can optionally include the sidewalls of the electromagnetic shielding encapsulation having an electrical resistivity of less than 1*10-3 Ωm.

In example 11, the subject matter of one of the examples 1-10 can optionally include the sidewalls of the electromagnetic shielding encapsulation comprising a stamped sheet metal or tin-plated stainless steel.

In example 12, the subject matter of one of the previous examples can optionally include a height of the sidewalls of the electromagnetic shielding encapsulation being larger than a height of the electrical component.

In example 13, the subject matter of one of the examples 1-12 can optionally include the carrier substrate being at least one of a printed circuit board, a module board and a semiconductor package substrate.

In example 14, the subject matter of one of the examples 1-13 can optionally include the at least one electrical component being a semiconductor device.

In example 15, the subject matter of example 14 can optionally include the semiconductor device being a transceiver device electrically coupled to at least one antenna located outside the electromagnetic shielding encapsulation.

In example 16, the subject matter of one of the examples 1-15 can optionally include at least a second electrical component arranged on the carrier substrate and within the electromagnetic shielding encapsulation.

In example 17, the subject matter of one of the examples 1-16 can optionally include a gap filler structure located between the at least one electrical component and a back side of the heat sink, wherein the gap filler structure is in contact with the at least one electrical component and the back side of the heat sink.

In example 18, the subject matter of example 17 can optionally include the gap filler structure comprises a thermal conductivity of more than 3 W/(m*K).

In example 19, the subject matter of one of the examples 1-18 can optionally include at least one internal sidewall of the electromagnetic shielding encapsulation, wherein the at least one internal sidewall of the electromagnetic shielding encapsulation separates at least two encapsulation chambers of the electromagnetic shielding encapsulation from each other, wherein at least one electrical component is arranged within each of the at least two encapsulation chambers of the electromagnetic shielding encapsulation.

Example 20 relates to a method for forming an electrical device, the method comprising attaching at least one electrical component on a carrier substrate, forming or attaching side walls of an electromagnetic shielding encapsulation on the carrier substrate before or after attaching the at least one electrical component, wherein the sidewalls of the electromagnetic shielding encapsulation laterally surround the at least one electrical component and mounting a heat sink to the sidewalls of the electromagnetic shielding encapsulation, wherein the heat sink forms a cap of the electromagnetic shielding encapsulation, wherein the heat sink comprises surface-enlarging structures at a front side of the heat sink.

In example 21, the subject matter of example 20 can optionally include mounting the heat sink comprising fixing the heat sink on the sidewalls of an electromagnetic shielding encapsulation by a gasket material.

In example 22, the subject matter of example 20 or 21 can optionally include forming or attaching the side walls comprising attaching stamped metal sheet side walls or tin-plated stainless steel side walls on the carrier substrate.

In example 23, the subject matter of one of the examples 20 to 22 can optionally include forming or attaching a gap filler structure on the at least one electrical component, wherein the heat sink is mounted so that the gap filler structure is in contact with the back side of the heat sink.

Example 24 is a machine readable storage medium including program code, when executed, to cause a machine to perform the method of one of the examples 20 to 23.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

The invention claimed is:

1. An electrical device comprising:
   at least one electrical component arranged on a carrier substrate;
   sidewalls of an electromagnetic shielding encapsulation arranged on the carrier substrate, wherein the sidewalls of the electromagnetic shielding encapsulation laterally surround the at least one electrical component; and
   a heat sink mounted to the sidewalls of the electromagnetic shielding encapsulation, wherein the heat sink forms a cap of the electromagnetic shielding encapsulation, wherein the heat sink comprises surface-enlarging structures at a front side of the heat sink, and
     wherein the heat sink is fixed on the sidewalls of an electromagnetic shielding encapsulation by a gasket material,
       wherein the gasket material has a thermal conductivity of more than 3 W/(m*K), and
       wherein the gasket material has an electrical resistivity of less than $1*10^{-3}$ $\Omega$m.

2. The electrical device according to claim 1, wherein the gasket material is a conductive carbon rubber material or a carbon filled silicon rubber material.

3. The electrical device according to claim 1, wherein the gasket material seals a gap between the heat sink and the sidewalls of the electromagnetic shielding encapsulation.

4. The electrical device according to claim 1, wherein the heat sink comprises at least one of aluminum and copper.

5. The electrical device according to claim 1, wherein the surface-enlarging structures of the heat sink are a plurality of fin-shaped structures or pin-shaped structures.

6. The electrical device according to claim 1, wherein a body portion of the heat sink and the surface-enlarging structures of the heat sink are one-pieced, wherein a surface of the body portion forms a back side of the heat sink.

7. The electrical device according to claim 1, wherein the sidewalls of the electromagnetic shielding encapsulation have an electrical resistivity of less than 1*10-3 $\Omega$m.

8. The electrical device according to claim 1, wherein the sidewalls of the electromagnetic shielding encapsulation comprise a stamped sheet metal or tin-plated stainless steel.

9. The electrical device according to claim 1, wherein a height of the sidewalls of the electromagnetic shielding encapsulation is larger than a height of the electrical component.

10. The electrical device according to claim 1, wherein the carrier substrate is at least one of a printed circuit board, a module board and a semiconductor package substrate.

11. The electrical device according to claim 1, wherein the at least one electrical component is a semiconductor device.

12. The electrical device according to claim 11, wherein the semiconductor device is a transceiver device electrically coupled to at least one antenna located outside the electromagnetic shielding encapsulation.

13. The electrical device according to claim 1, further comprising at least a second electrical component arranged on the carrier substrate and within the electromagnetic shielding encapsulation.

14. The electrical device according to claim 1, further comprising a gap filler structure located between the at least one electrical component and a back side of the heat sink, wherein the gap filler structure is in contact with the at least one electrical component and the back side of the heat sink.

15. The electrical device according to claim 14, wherein the gap filler structure comprises a thermal conductivity of more than 3 W/(m*K).

16. The electrical device according to claim 1, further comprising at least one internal sidewall of the electromagnetic shielding encapsulation, wherein the at least one internal sidewall of the electromagnetic shielding encapsulation separates at least two encapsulation chambers of the electromagnetic shielding encapsulation from each other, wherein at least one electrical component is arranged within each of the at least two encapsulation chambers of the electromagnetic shielding encapsulation.

17. A method for forming an electrical device, the method comprising:
attaching at least one electrical component on a carrier substrate;
forming or attaching side walls of an electromagnetic shielding encapsulation on the carrier substrate before or after attaching the at least one electrical component, wherein the sidewalls of the electromagnetic shielding encapsulation laterally surround the at least one electrical component; and
mounting a heat sink to the sidewalls of the electromagnetic shielding encapsulation,
wherein the heat sink forms a cap of the electromagnetic shielding encapsulation,
wherein the heat sink comprises surface-enlarging structures at a front side of the heat sink, and
wherein mounting the heat sink comprises fixing the heat sink on the sidewalls of an electromagnetic shielding encapsulation by a gasket material,
wherein the gasket material has a thermal conductivity of more than 3 W/(m*K), and
wherein the gasket material has an electrical resistivity of less than $1*10^{-3}$ Ωm.

18. The method according to claim 17, wherein forming or attaching the side walls comprises attaching stamped metal sheet side walls or tin-plated stainless steel side walls on the carrier substrate.

19. The method according to claim 17, further comprising forming or attaching a gap filler structure on the at least one electrical component, wherein the heat sink is mounted so that the gap filler structure is in contact with the back side of the heat sink.

* * * * *